United States Patent
Tada

(12) United States Patent (10) Patent No.: US 7,361,947 B2
Tada (45) Date of Patent: Apr. 22, 2008

(54) PHOTOELECTRIC CONVERSION ELEMENT AND DISPLAY DEVICE INCLUDING THE SAME

(75) Inventor: Norio Tada, Kumagaya (JP)

(73) Assignee: Toshiba Matsushita Display Technology Co., Ltd., Tokyo (JP)

(*) Notice: Subject to any disclaimer, the term of this patent is extended or adjusted under 35 U.S.C. 154(b) by 203 days.

(21) Appl. No.: 11/316,737

(22) Filed: Dec. 27, 2005

(65) Prior Publication Data
US 2006/0138421 A1 Jun. 29, 2006

(30) Foreign Application Priority Data
Dec. 28, 2004 (JP) ............................. 2004-381031

(51) Int. Cl.
*H01L 31/062* (2006.01)
(52) U.S. Cl. ........................ 257/290; 257/403
(58) Field of Classification Search ................ 257/290, 257/291, 59, 72, 348, 403, 408, 462
See application file for complete search history.

(56) References Cited

U.S. PATENT DOCUMENTS 4,598,305 A * 7/1986 Chiang et al. ................ 257/66
7,265,740 B2 * 9/2007 Tada et al. .................... 345/91

FOREIGN PATENT DOCUMENTS

JP 2004-119719 4/2004
JP 2004-159273 6/2004

* cited by examiner

*Primary Examiner*—Mark V. Prenty
(74) *Attorney, Agent, or Firm*—Oblon, Spivak, McClelland, Maier & Neustadt, P.C.

(57) ABSTRACT

A photoelectric conversion element includes a semiconductor layer including a pair of $p^+$ regions in which p-type impurities are doped, and a $p^-$ region which is disposed between the $p^+$ regions and has a lower p-type impurity concentration than the $p^+$ regions. A gate electrode is formed over the $p^-$ region via a gate insulation film, thus, a p-MOS structure is formed. A width of the gate electrode is less than a width of the $p^-$ region. A $p^-$ region, which is a portion of the $p^-$ region and is located immediately below the gate electrode, forms a light receiving layer, and $p^-$ regions, which are portions of the $p^-$ region and are located away from below the gate electrode, form LDD regions. The photoelectric conversion element is fabricated on the same substrate as a thin-film transistor for a driving circuit, thereby constructing a display device with an input function.

9 Claims, 5 Drawing Sheets

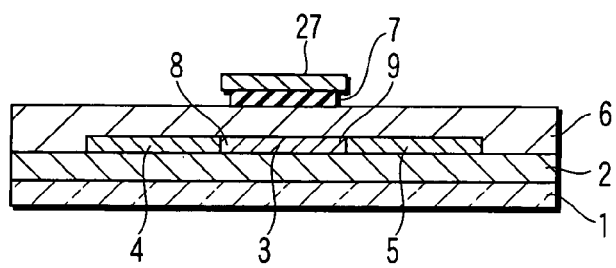
F I G. 3G
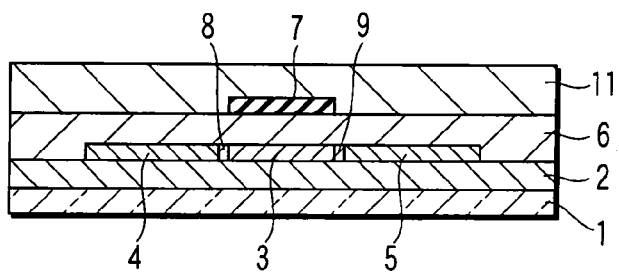
F I G. 3H
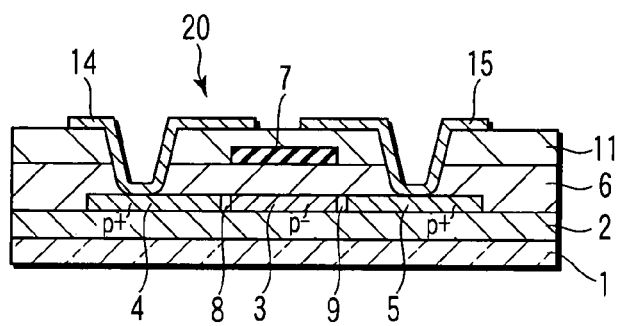
F I G. 3I
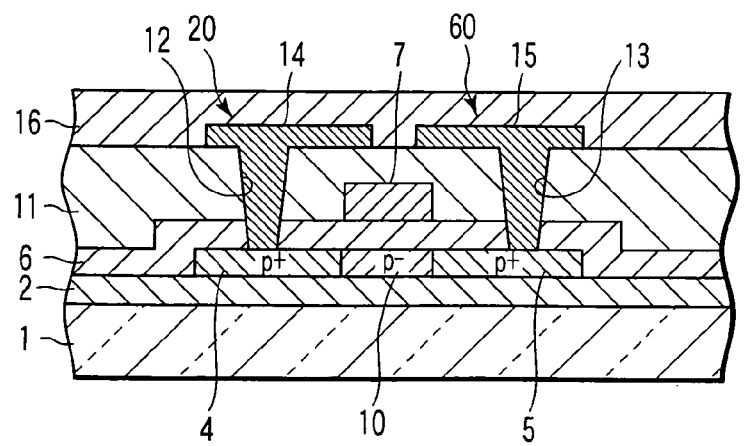
F I G. 4

PHOTOELECTRIC CONVERSION ELEMENT AND DISPLAY DEVICE INCLUDING THE SAME

CROSS-REFERENCE TO RELATED APPLICATIONS

This application is based upon and claims the benefit of priority from prior Japanese Patent Application No. 2004-381031, filed Dec. 28, 2004, the entire contents of which are incorporated herein by reference.

BACKGROUND OF THE INVENTION

1. Field of the Invention

The present invention relates to a photoelectric conversion element having a p-MOS structure, and to a display device that uses the photoelectric conversion element as a light receiving element and has a display function and an input function.

2. Description of the Related Art

A liquid crystal display device, which is a kind of flat-panel display device, is applied to various technical fields of OA equipment, information terminals, timepieces, TVs, etc., because of its features such as light weight, small thickness and low power consumption. In particular, a liquid crystal display device using thin-film transistors (TFT devices) has good responsivity, and is thus used as a display for various kinds of electronic devices such as mobile phones, TVs and computers.

In recent years, the range of uses of the flat-panel display device has been increasing more and more, and display devices with additional data input functions of, e.g. a touch-panel type or a pen-input type, have been developed. If direct input to the screen of the display device is enabled, the user interface can remarkably be improved. However, in the touch-panel type or pen-input type display device, it is necessary to add various components for the additional data input function, leading to a complex structure of the device and an increase in cost.

As regards the flat-panel display device such as a liquid crystal display device, a technique for reducing the manufacturing cost has been developed, wherein a driving circuit, which is conventionally an external attachment component, is formed by integrating TFTs on a major surface of a light-transmissive substrate (glass substrate). If this technique is employed to fabricate photosensor elements on a glass substrate and to provide a scanning function at the same time as the formation of the driving circuit, it is expected that the manufacturing cost of the liquid crystal display device having the input function can be reduced and the added value can be enhanced.

In Jpn. Pat. Appln. KOKAI Publication No. 2004-159273, the applicant of the present application proposed a display device wherein a light receiving sensor is fabricated in a pixel array section. Further in Jpn. Pat. Appln. KOKAI Publication No. 2004-119719, the applicant proposed a diode for a photosensor, which is usable in this kind of display device.

In the case where the light receiving sensor is fabricated in the pixel array section, as in the invention of KOKAI Publication No. 2004-159273, if the TFT for the driving circuit and the light receiving sensor can be fabricated in the same fabrication step, the manufacturing process can be simplified and the manufacturing cost can greatly be reduced.

As processes for fabricating a driving circuit on a glass substrate, there are known a C-MOS process in which the circuit is constituted by both an n-channel TFT and a p-channel TFT, and a p-MOS process in which the circuit is constituted by a p-channel TFT alone. The former process is advantageous in that a high-level driving circuit can be fabricated, but the manufacturing cost is increased. Thus, the former process is applied to the manufacture of small-sized panels, wherein many glass substrates can be obtained from a single glass substrate. The latter process is applied only to the manufacture of driving circuits with simple structure, but the manufacturing cost can be reduced. Thus, the latter process is applied mainly to large-sized panels.

In order to realize manufacture of a large-sized panel while reducing the manufacturing cost, it is necessary to fabricate a light receiving element by the p-MOS process. However, as disclosed in the invention of Jpn. Pat. Appln. KOKAI Publication No. 2004-119719, the conventional light receiving element (photosensor element) has the PIN diode structure. Thus, when the light receiving element is to be fabricated, there is no choice but to adopt the C-MOS process. As a result, there is such a problem that the manufacturing cost increases and the C-MOS process is applicable only to small-sized panels.

BRIEF SUMMARY OF THE INVENTION

The present invention has been made in consideration of the above-described circumstances in the prior art, and an object of the invention is to provide a photoelectric conversion element that can be fabricated together with a driving circuit at the same time by a p-MOS process, and that has excellent characteristics. Another object of the invention is to provide a display device that includes a photoelectric conversion element and can achieve simplification of a manufacturing process, reduction in manufacturing cost and realization of a large-sized panel.

In order to achieve the objects, according to an aspect of the present invention, there is provided a photoelectric conversion element comprising a p-MOS structure that includes: a semiconductor layer including a pair of $p^+$ regions in which p-type impurities are doped, and a $p^-$ region which is disposed between the $p^+$ regions and has a lower p-type impurity concentration than the $p^+$ regions; and a gate electrode formed over the $p^-$ region via an insulation film, a width of the gate electrode being less than a width of the $p^-$ region, and a $p^-$ region, which is a portion of the $p^-$ region and is located immediately below the gate electrode, forming a light receiving layer, and $p^-$ regions, which are portions of the $p^-$ region and are located away from below the gate electrode, forming lightly-doped drain regions.

According to another aspect of the present invention, there is provided a display device comprising a substrate, a thin-film transistors which are formed on the substrate and constitutes a driving circuit that executes a display control, and a plurality of light receiving elements formed on the substrate, the display device having a display function and an input function, each of the thin-film transistors and the light receiving elements having a p-MOS structure, each of the light receiving elements having a p-MOS structure that includes: a semiconductor layer including a pair of $p^+$ regions in which p-type impurities are doped, and a $p^-$ region which is disposed between the $p^+$ regions and has a lower p-type impurity concentration than the $p^+$ regions; and a gate electrode formed over the $p^-$ region via an insulation film, and a width of the gate electrode being less than a width of the $p^-$ region, and a $p^-$ region, which is a portion of the p⁻ region and is located immediately below the gate electrode, forming a light receiving layer, and p⁻ regions, which are portions of the p⁻ region and are located away from below the gate electrode, forming lightly-doped drain regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3G is a cross-sectional view illustrating a step of forming a gate electrode and LDD regions by re-etching of the first metal layer;

FIG. 3H is a cross-sectional view illustrating a step of forming a second insulation layer;

FIG. 3I is a cross-sectional view illustrating a step of forming an anode electrode and a cathode electrode;

FIG. 4 is a cross-sectional view that schematically shows a photoelectric conversion element according to a comparative example;

DETAILED DESCRIPTION OF THE INVENTION

A photoelectric conversion element according to an embodiment of the present invention, a method of manufacturing the photoelectric conversion element, and a display device including the photoelectric conversion element will now be described with reference to the accompanying drawings.

Figure 1:
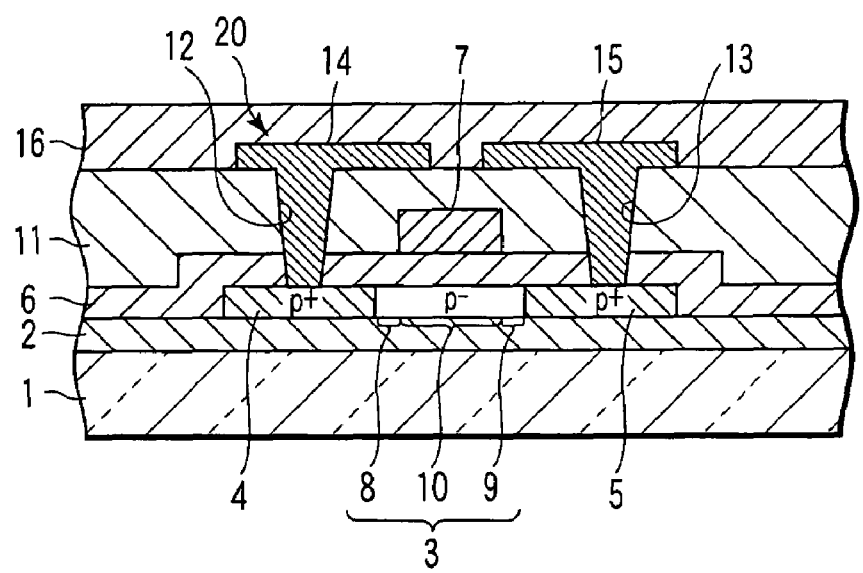
FIG. 1 is a cross-sectional view that schematically shows a photoelectric conversion element according to an embodiment of the present invention.
Figure 2:
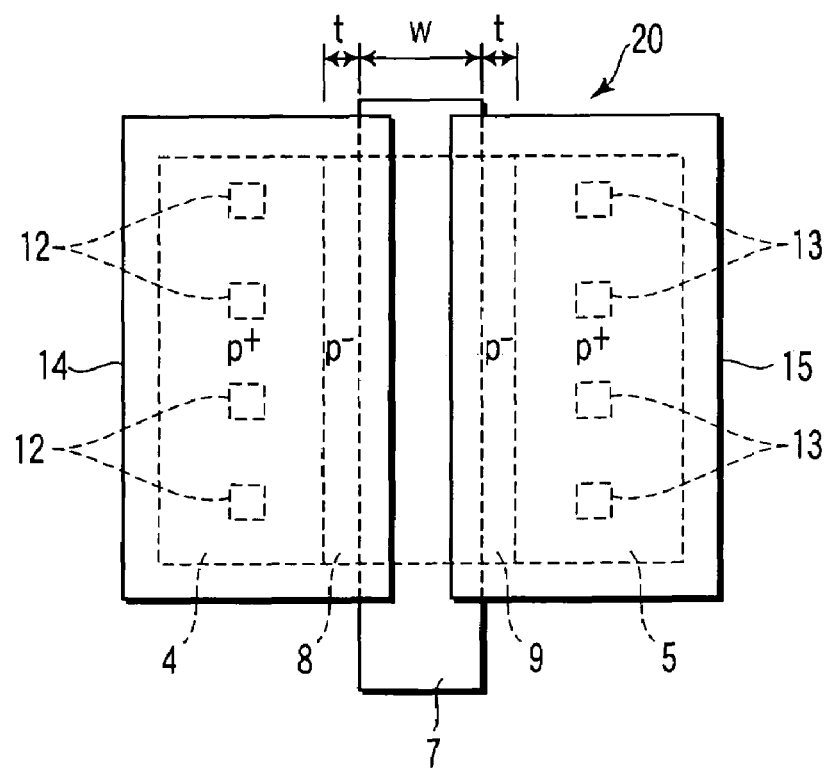
FIG. 2 is a plan view that schematically shows the photoelectric conversion element.

FIG. 1 and FIG. 2 show a photoelectric conversion element 20 according to the embodiment. As is shown in FIGS. 1 and 2, the photoelectric conversion element 20 has a p-channel TFT structure, like a thin-film transistor for a driving circuit that executes a display control in a liquid crystal display device.

The photoelectric conversion element 20 is formed on a glass substrate 1, which is a substantially transparent, rectangular-plate-shaped insulating substrate. An undercoat layer 2, which is formed of, for instance, a silicon nitride film (SiNx film), a silicon oxide film (SiOx film), or the like, is formed on one major surface (front surface) of the glass substrate 1. The photoelectric conversion element 20 includes a low-concentration impurity layer 3 that is formed on the undercoat layer 2. The low-concentration impurity layer 3 is formed of polysilicon and functions as a light receiving layer or an active layer. The low-concentration impurity layer 3 constitutes a p⁻ region.

On both sides of the low-concentration impurity layer 3, p⁺ regions 4 and 5, which have a higher impurity concentration than the low-concentration impurity layer 3, are provided such that the p⁺ regions 4 and 5 are electrically connected to, and are continuous with, the low-concentration impurity layer 3. The p⁺ regions 4 and 5 correspond to a source and a drain of a p-channel TFT. In the photoelectric conversion element, the p⁺ region 4, 5 functions as an anode electrode or a cathode electrode. The low-concentration impurity layer 3 and the p⁺ regions 4 and 5 are formed of a single polysilicon layer. The p⁺ regions 4 and 5 are formed by diffusing high-concentration p-type impurities into both-side portions of the low-concentration impurity layer 3.

A gate insulation film 6 is formed over the low-concentration impurity layer 3, the p⁺ regions 4 and 5 and the undercoat layer 2. Further, a metal (first metal) layer is formed on the gate insulation film. Thus, a gate electrode 7 is formed such that it is stacked on the gate insulation film 6.

The gate electrode 7 is arranged to be opposed to the low-concentration impurity layer 3. The width W of the gate electrode 7 is set to be substantially equal to the width of the low-concentration impurity layer 3. In the photoelectric conversion element 20 of this embodiment, the width W of the gate electrode 7 is set to be slightly less than the width of the low-concentration impurity layer 3. As a result, the low-concentration impurity layer 3 projects from a region just below the gate electrode 7, and p⁻ regions that project from the region below the gate electrode 7 constitute low-concentration impurity or lightly-doped drain (LDD) regions 8 and 9.

Of the low-concentration impurity layer 3, the portion that is opposed to the gate electrode 7 functions as a light receiving layer (active layer) 10, and both side portions that project from the region below the gate electrode 7 constitute the LDD regions 8 and 9. The p⁺ regions 4, and 5, which function as an anode electrode or a cathode electrode, is electrically connected to the active layer 10 via the LDD regions 8, and 9, which have a high electric resistance.

The width W of the gate electrode 7 and the width t of each LDD region 8, and 9 may arbitrarily be set. In this example, the width W of the gate electrode 7 is set to be slightly greater than the width of an ordinary p-channel TFT, for instance, W=5 μm or more. Preferably, the width t of the LDD regions 8, and 9 should be set in a range of 0.1 μm to 1.5 μm. If the width t of the LDD regions 8, and 9 is too small, the effect of the provision of the LDD regions 8, and 9 may become deficient. On the other hand, if the width t is too great, the resistance value of the LDD regions 8, and 9 becomes excessively large, resulting in deficiency of photoelectric current.

Since the active layer 10 and LDD regions 8 and 9 are the parts of the low-concentration impurity layer 3, they are formed of low-concentration impurity layers with the same impurity concentration. However, it is possible to arbitrarily set the impurity concentration of the LDD regions 8, 9 within a range that is lower than the impurity concentration of the p$^+$ regions 4, 5. In this case, the active layer 10 and LDD regions 8 and 9 may be formed of low-concentration impurity layers with different impurity concentrations.

A silicon oxide film having insulating properties is formed over the gate electrode 7 and the gate insulation film 6, thereby forming an interlayer insulation film 11 as a second insulation film. A plurality (e.g. four) of contact holes 12 and a plurality of (e.g. four) of contact holes 13 are formed so as to penetrate the interlayer insulation film 11 and gate insulation film 6, respectively, in association with the p$^+$ regions 4 and 5. The p$^+$ region 4 is exposed at the bottom of the contact holes 12, and the p$^+$ region 5 is exposed at the bottom of the contact holes 13.

A metal (second metal) layer is formed on the interlayer insulation film 11 so as to fill the contact holes 12 and 13, thereby forming P electrodes 14 and 15. The P electrodes 14, and 15 are electrically connected to the respective p$^+$ regions 4, and 5 via the contact holes 12, and 13, thus functioning as the anode electrodes or cathode electrodes. The P electrodes 14 and 15 are formed to cover the LDD regions 8 and 9 and parts of the gate electrode 7, and function also as light shield members.

A passivation film 16, which is formed of, e.g. a silicon nitride film, is formed on the entire surface of the interlayer insulation film 11 and P electrodes 14 and 15. The passivation film 16 functions as a protection film for the photoelectric conversion element.

Next, a manufacturing process of the photoelectric conversion element having the above-described structure is described.

Figure 3A:
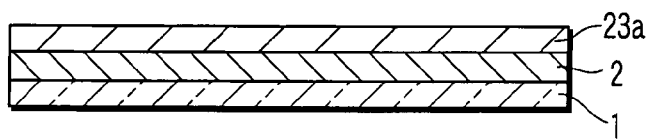
FIG. 3A is a cross-sectional view illustrating a step of forming an undercoat layer and an amorphous silicon layer of a photoelectric conversion element with a p-MOS structure.

The photoelectric conversion element is manufactured by a p-MOS manufacturing process. To start with, as shown in FIG. 3A, an undercoat layer 2, which is formed of, e.g. a silicon nitride film or a silicon oxide film, is formed by CVD on an insulating substrate 1 of, e.g. a glass substrate. The undercoat layer 2 prevents impurities from diffusing into an element that is to be formed above the insulating substrate 1.

Figure 3B:
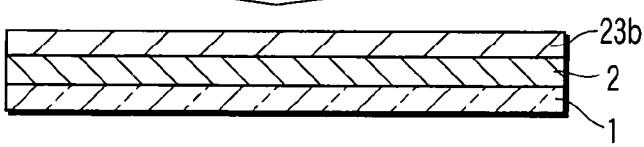
FIG. 3B is a cross-sectional view illustrating a step of polysilicon formation.

An amorphous silicon film 23a with a thickness of about 500 Å is formed over the insulating substrate 1 by, e.g. PECVD or sputtering. Then, as shown in FIG. 3B, a laser beam is radiated on the amorphous silicon film 23a, thereby crystallizing the amorphous silicon and forming a polysilicon layer 23b.

Figure 3C:
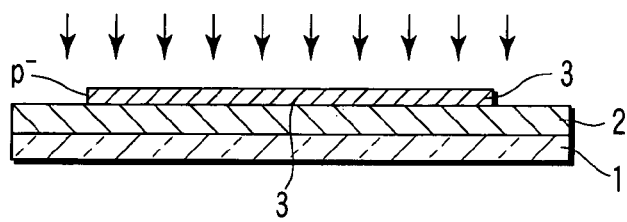
FIG. 3C is a cross-sectional view illustrating a step of low-concentration ion doping.
Figure 3D:
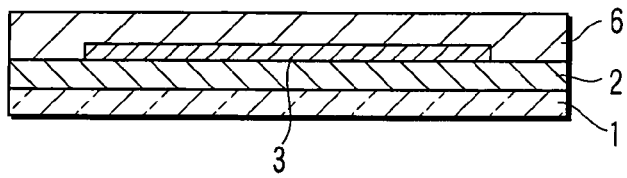
FIG. 3D is a cross-sectional view illustrating a step of forming a first insulation layer.

As shown in FIG. 3C, low-concentration boron is ion-doped in the entire surface of the polysilicon layer 23b so that the polysilicon layer 23b may become a low-concentration impurity layer (p$^-$ layer) 3. Further, the low-concentration impurity layer is patterned into a predetermined shape. A silicon oxide film is formed on the low-concentration impurity layer 3 by, e.g. PECVD or ECR-CVD, thus forming a gate insulation film 6 that covers the low-concentration impurity layer 3 (FIG. 3D).

Figure 3E:
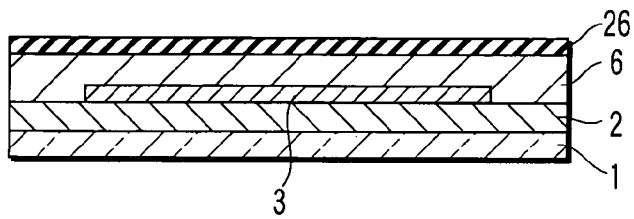
FIG. 3E is a cross-sectional view illustrating a step of forming a first metal layer.
Figure 3F:
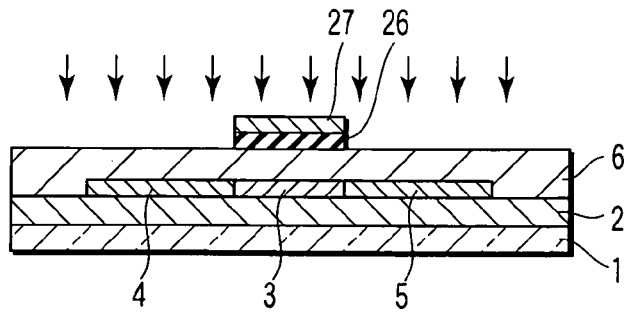
FIG. 3F is a cross-sectional view illustrating a first metal layer etching step and a high-concentration ion doping step.

As shown in FIG. 3E, using Mo—Ta or Mo—W, a first metal layer 26 is formed on the gate insulation film 6. A resist 27 is provided on the first metal layer 26, and the resist 27 is patterned into a predetermined shape. As shown in FIG. 3F, using the resist 27 as a mask, the first metal layer 26 is patterned. In this case, the first metal layer 26 is patterned such that the anode region and cathode region of the photoelectric conversion element are opened.

Using the resist 27 and first metal layer 26 as a mask, high-concentration P-type impurities, such as boron, are ion-doped in the low-concentration impurity layer 3. Thereby, both side portions of the low-concentration impurity layer 3 become p$^+$ regions 4 and 5. Further, as shown in FIG. 3G, using the resist 27 as a mask, the first metal layer 26 is re-etched to set back the resist layer 27 from the first metal layer 26, thus forming a gate electrode 7. By executing the re-etching to decrease the width of the first metal layer 26 and to form the gate electrode 7, both end portions of the low-concentration impurity layer 3 are set off the region immediately below the gate electrode 7, and LDD regions 8 and 9 are formed.

The resist 27 is removed, and the entire insulating substrate 1 is annealed at bout 500° C., thereby activating the doped impurities. The insulating substrate 1 is then subjected to a hydrogenation process and exposed to a plasma of hydrogen. Following the hydrogenation, as shown in FIG. 3H, an interlayer insulation film 11, which is made of a silicon oxide film, is formed on the gate electrode 7 and gate insulation film 6 in the CVD apparatus.

As shown in FIG. 3I, a plurality of contact holes 12 and 13 are formed in the gate insulation film 6 and interlayer insulation film 11 so that parts of the p$^+$ regions 28 and 29 are exposed. Subsequently, a second metal layer is formed on the interlayer insulation film 11 so as to fill the contact holes 12 and 13. The second metal layer is patterned to form an anode electrode 14 and a cathode electrode 15. The formed anode electrode 14 and cathode electrode 15 cover the LDD regions 8 and 9 and parts of the gate electrode 7 of the photoelectric conversion element, and serve also as light shield layers. At last, although not shown, a silicon nitride film is formed as a passivation film over the interlayer insulation film 11, anode electrode 14 and cathode electrode 15. The photoelectric conversion element is thus completed.

The above-described photoelectric conversion element 20 and a photoelectric conversion element, which is a comparative example, were fabricated, and their characteristics were compared.

EMBODIMENT

The photoelectric conversion element 20 with the p-MOS structure, as shown in FIGS. 1 and 2, was fabricated. In the photoelectric conversion element 20, the width W of the gate electrode 7 is set at 5 μm, and the width t of each LDD region 8, 9 is set at 1 μm.

COMPARATIVE EXAMPLE

Figure 5:
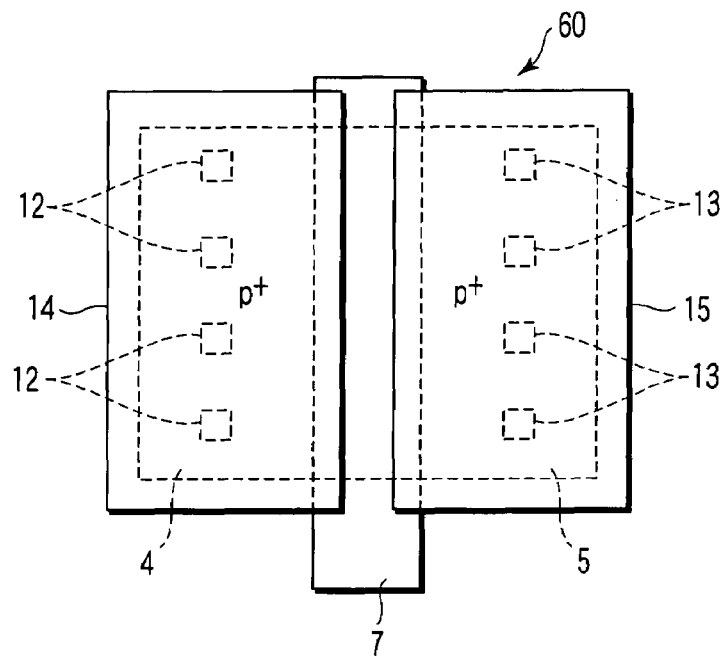
FIG. 5 is a plan view that schematically shows the photoelectric conversion element according to the comparative example.

A photoelectric conversion element 60 having a structure shown in FIG. 4 and FIG. 5 was fabricated. In this comparative example, the width of the gate electrode 7 is substantially equal to the width of the low-concentration impurity layer 3, and LDD regions 8 and 9 are not formed in the low-concentration impurity layer 3. In the other respects, the structure of the photoelectric conversion element 60 is the same as the structure of the photoelectric conversion element 20. The common parts are denoted by like reference numerals, and a detailed description is omitted here.

(Photoelectric Current Versus Gate Voltage Characteristics)

Figure 6:
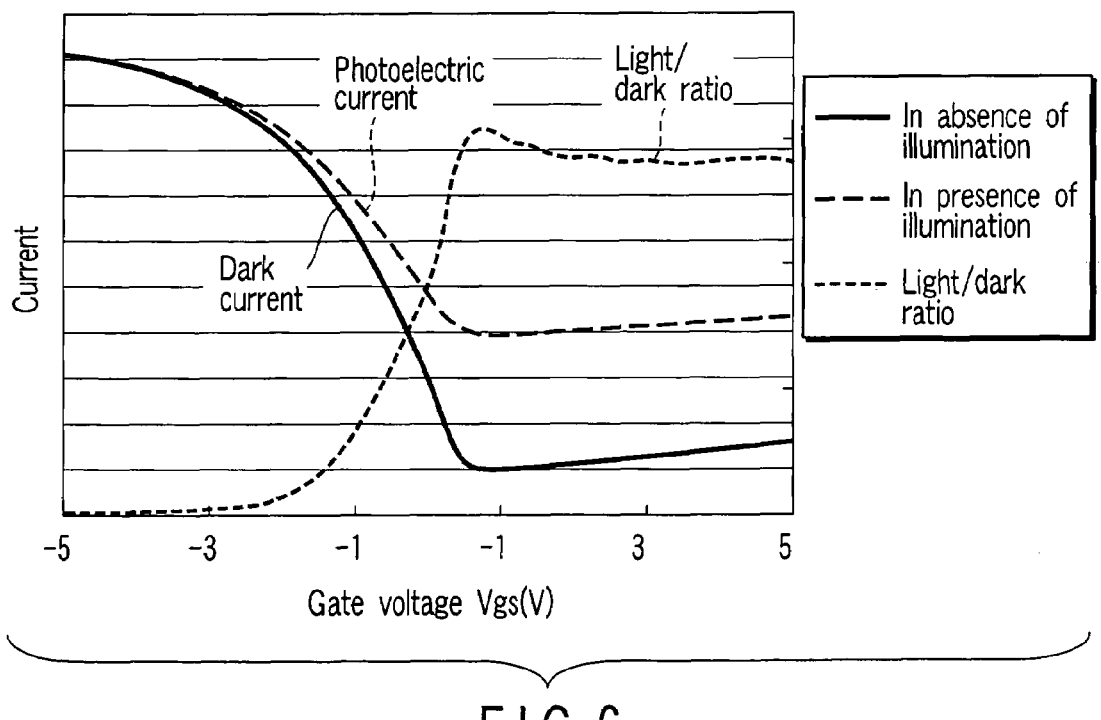
FIG. 6 is a characteristic graph showing photoelectric current versus gate voltage characteristics in the photoelectric conversion element of the embodiment.
Figure 7:
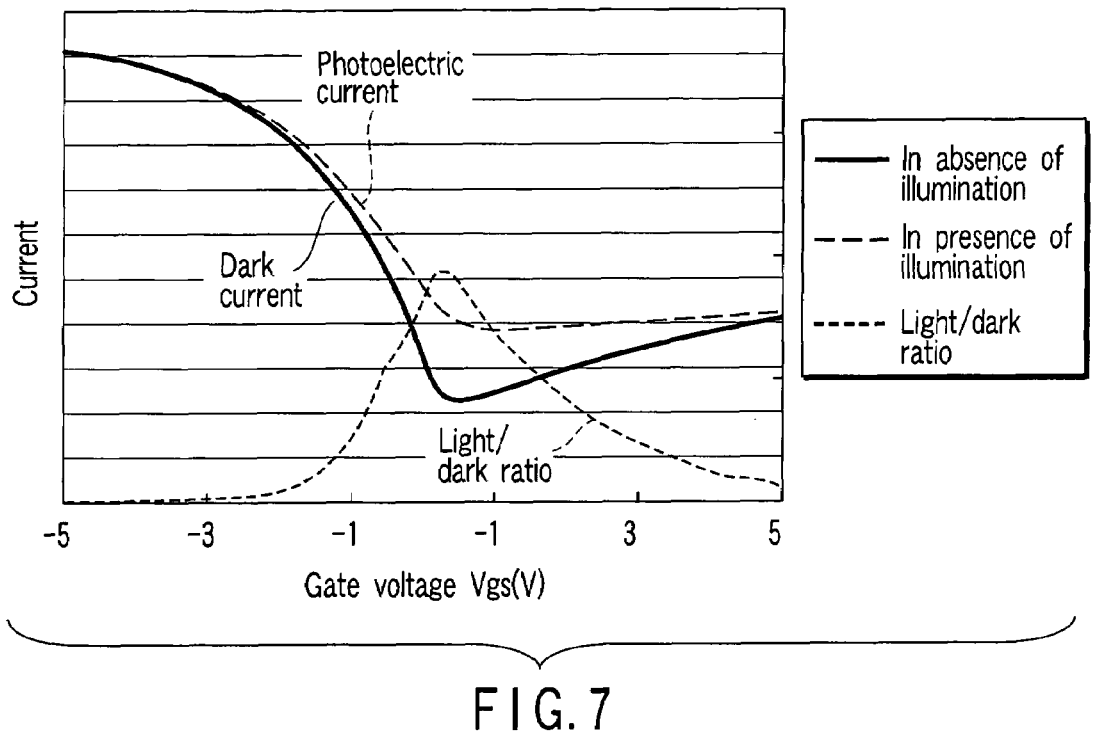
FIG. 7 is a characteristic graph showing photoelectric current versus gate voltage characteristics in the photoelectric conversion element of the comparative example.

FIG. 6 shows the photoelectric current versus gate voltage characteristics in the photoelectric conversion element 20 of the embodiment, and FIG. 7 shows the photoelectric current versus gate voltage characteristics in the photoelectric conversion element of the comparative example. As is clear from FIGS. 6 and 7, in the photoelectric conversion element 20 of the embodiment, a dark current in the absence of illumination decreases. A ratio between a light current in the presence of illumination and the dark current, that is, a light/dark ratio, is improved. Moreover, in the photoelectric conversion element 20 of the embodiment, even when the gate voltage Vgs rises to the positive side, the dark current does not increase, and there is no decrease in the light/dark ratio.

On the other hand, in the photoelectric conversion element 60 of the comparative example, the dark current is high, and the light/dark ratio is low. In addition, in the photoelectric conversion element 60, when the gate voltage Vgs rises to the positive side, the dark current increases and the light/dark current decreases. It is thus understood that the light/dark ratio of a certain level is obtained only within a very limited voltage range.

As is understood from the above comparison result, the photoelectric conversion element 20 with excellent characteristics can be obtained by the present embodiment.

As has been described above, according to the present embodiment, the photoelectric conversion element 20 has a p-MOS structure in order to make it possible to manufacture the photoelectric conversion element 20 by a p-MOS process. Thereby, an increase in manufacturing cost is suppressed, and a large panel of a display device, for example, can be realized. In the photoelectric conversion element fabricated by the p-MOS process, however, the dark current cannot be suppressed and it is difficult to secure a light/dark ratio between the light current and dark current. As a result, the function of the photoelectric conversion element as a photosensor element cannot fully be exhibited. To solve this problem, the present embodiment adopts the structure wherein the width w of the gate electrode 7 is made less than the width of the p⁻ region, and p⁻ regions (LDD regions) functioning as low-concentration impurity regions are provided in the so-called p-channel TFT. Thereby, the dark current is reduced and an adequate light/dark ratio is secured, and the performance of the photoelectric conversion element can be enhanced.

According to this photoelectric conversion element, it is possible to secure the light/dark ratio by suppressing the dark current, while adopting the p-MOS structure. It is possible, therefore, to provide the photoelectric conversion element that can be manufactured by the low-cost manufacturing process and has a high performance.

For example, a TFT (p-channel TFT), which is used in the driving circuit for executing a display control in the display device, can be formed in the same manufacturing process as the photoelectric conversion element. Accordingly, in a display device with an input function, a photoelectric conversion element may be fabricated at the same time as the TFT for the driving circuit in the pixel array section. Thereby, the manufacturing process for the entire device is simplified, and the manufacturing cost can be reduced.

Figure 8:
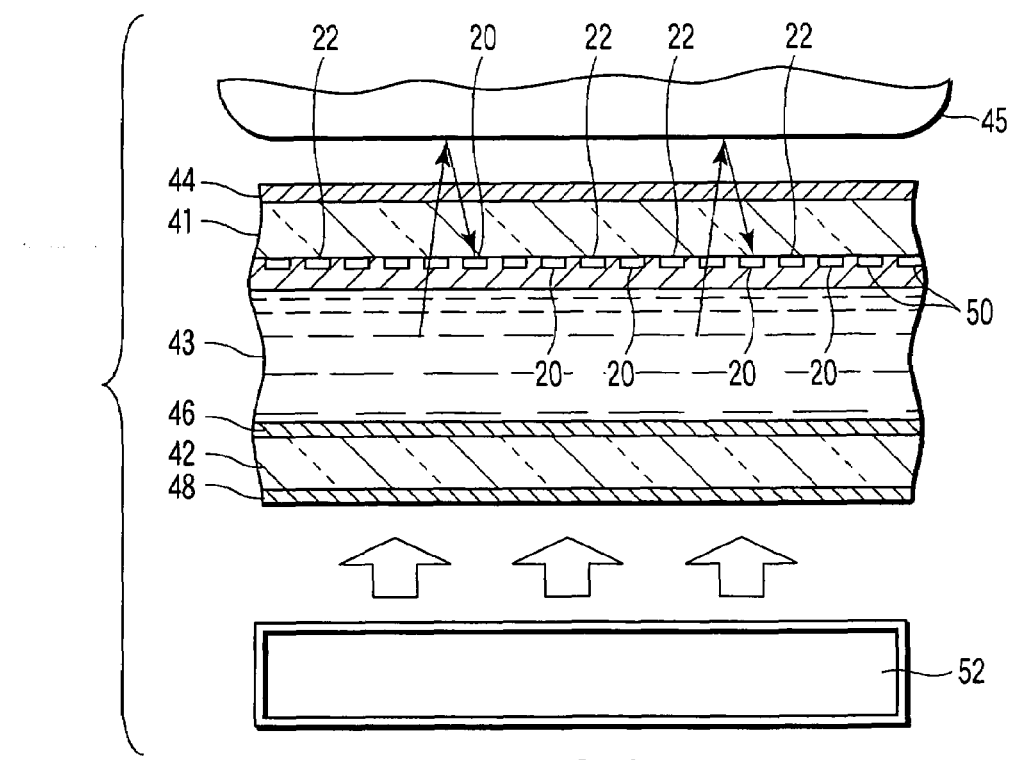
FIG. 8 is a cross-sectional view that schematically shows a liquid crystal display device with an image scan function according to an embodiment of the invention.

FIG. 8 shows an example of the display device in which the TFT for the driving circuit and the light receiving element are fabricated on the array substrate. This display device is an example of the liquid crystal display device having the input function, that is, an image scanning function. The display device comprises an array substrate 41 on which pixel electrodes 22, switching elements (not shown), etc. are arranged in a matrix, a counter-substrate 42 that is disposed to be opposed to the array substrate with a gap, and a liquid crystal layer 43 that is held between the array substrate and the counter-substrate. A plurality of the above-described photoelectric conversion elements 20, which function as light receiving elements, are disposed, for example, in a matrix on the array substrate 41. In addition, a plurality of TFTs, e.g. p-channel TFTs 50, which constitute the driving circuit, are formed on the array substrate 41. A polarizer film 44 is provided on the outer surface of the array substrate 41. A common electrode 46 is formed on the inner surface of the counter-substrate 42, and a polarizer plate 48 is provided on the outer surface of the counter-substrate 42.

In an ordinary liquid crystal display device, a backlight 52 that functions as a light source is disposed on the back side of the array substrate 41, and a display image is viewed from the counter-substrate 42 side. By contrast, in the liquid crystal display device according to this embodiment, the backlight 52 is disposed on the back side of the counter-substrate 42, and a display image is viewed from the array substrate 41 side. In addition, data can be input by the photoelectric conversion elements 20 from the array substrate 41 side.

For example, when an image is to be scanned, an object of scan, e.g. a paper sheet 45, is disposed on the arrange substrate 41. Light from the backlight 52 is radiated on the object 45 through the counter-substrate 42, liquid crystal layer 43 and array substrate 41. Reflective light from the object 45 is received by light receiving elements 46 on the array substrate 41, and the image is scanned.

In the liquid crystal display device with the above-described structure, if the p-channel TFTs, which constitute the driving circuit for executing the display control, and the photoelectric conversion elements 20 that function as light receiving elements, are formed on the array substrate 41 at the same time, the p-channel TFTs and the photoelectric conversion elements can be manufactured by the same process at the same time. In particular, if p-channel TFTs with the p-MOS structure are used as the thin-film transistors for the driving circuit, as described above, both the thin-film transistors and the light receiving elements have the p-MOS structure and can be batch-formed by the p-MOS process at the same time. Therefore, it is possible to provide a display device that has a high-quality scanning function and can be manufactured by a low-cost process. With the p-MOS process, a large-sized panel can be realized and, for example, a large-sized liquid crystal display device with an image scanning function, which has never been realized, can be obtained.

According to the above-described display device, by using the process with low manufacturing cost for large-sized panels, it becomes possible to achieve not only the ordinary function of displaying an image as the flat-panel display, but also achieve various input functions, for example, by detecting direct light from a light pen or reflective backlight from an object by means of the light receiving elements (photoelectric conversion elements) built in the pixels.

The present invention is not limited to the above-described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined.

For example, in the photoelectric conversion element, the LDD regions are formed on both sides of the light receiving layer. The invention is not limited to this configuration. The LDD region may be formed only on one side of the light receiving layer. The invention is applicable not only to the liquid crystal display device, but also to other types of flat-panel display devices such as a display device using organic EL. In any case, the manufacturing process can be simplified and the manufacturing cost can be reduced by fabricating, on the same substrate, the p-channel TFTs for the driving circuit, which executes the display control, and the photoelectric conversion elements, which are light receiving elements.

What is claimed is:

1. A photoelectric conversion element comprising:
a p-MOS structure that includes:
a semiconductor layer including a pair of $p^+$ regions in which p-type impurities are doped, and a $p^-$ region which is disposed between the $p^+$ regions and has a lower p-type impurity concentration than the $p^+$ regions;
a gate electrode formed over the $p^-$ region via an insulation film, a width of the gate electrode being less than a width of the $p^-$ region; and
a $p^-$ region, which is a portion of the $p^-$ region and is located immediately below the gate electrode, forming a light receiving layer, and $p^-$ regions, which are portions of the $p^-$ region and are located away from below the gate electrode, forming lightly-doped drain regions;
an anode electrode which is connected to one of the $p^+$ regions; and
a cathode electrode which is connected to the other of the $p^+$ regions,
wherein the anode electrode and the cathode electrode are arranged to cover the lightly-doped drain regions and parts of the gate electrode, and constitute light shield layers.

2. The photoelectric conversion element according to claim 1, wherein the $p^-$ regions that form the lightly-doped drain regions and the $p^-$ region that forms the light receiving layer are formed of low-concentration impurity layers having the same concentration.

3. The photoelectric conversion element according to claim 1, wherein the semiconductor layer includes the lightly-doped drain regions on both sides of the light receiving layer.

4. A display device comprising:
a substrate;
a plurality of thin-film transistors which are formed on the substrate and constitute a driving circuit that executes a display control; and
a plurality of light receiving elements formed on the substrate, the display device having a display function and an input function;
each of the thin-film transistors and the light receiving elements having a p-MOS structure,
each of the light receiving elements having a p-MOS structure that includes:
a semiconductor layer including a pair of $p^+$ regions in which p-type impurities are doped, and a $p^-$ region which is disposed between the $p^+$ regions and has a lower p-type impurity concentration than the $p^+$ regions; and
a gate electrode formed over the p region via an insulation film, and a width of the gate electrode being less than a width of the $p^-$ region; and
a $p^-$ region, which is a portion of the $p^-$ region and is located immediately below the gate electrode, forming a light receiving layer, and $p^-$ regions, which are portions of the $p^-$ region and are located away from below the gate electrode, forming lightly-doped drain regions.

5. The display device according to claim 4, which comprises:
an array substrate that includes the substrate and a plurality of pixel electrodes that are formed on the substrate;
a counter-substrate which has a common electrode and is opposed to the array substrate with a gap; and
a liquid crystal layer held between the array substrate and the counter-substrate.

6. The display device according to claim 5, further comprising a light source which is provided to face a back side of the counter-substrate.

7. The display device according to claim 4, wherein the $p^-$ regions which form the lightly-doped drain regions and the $p^-$ region which forms the light receiving layer are formed of low-concentration impurity layers having the same concentration.

8. The display device according to claim 4, wherein the semiconductor layer includes the lightly-doped drain regions on both sides of the light receiving layer.

9. The display device according to claim 4, further comprising an anode electrode that is connected to one of the $p^+$ regions, and a cathode electrode that is connected to the other of the $p^+$ regions.

* * * * *